US008384393B2

(12) United States Patent
Cohen

(10) Patent No.: US 8,384,393 B2
(45) Date of Patent: Feb. 26, 2013

(54) METHOD AND APPARATUS FOR EVALUATING ELECTROMAGNETIC HAZARD PROTECTION DEVICES

(75) Inventor: David A. Cohen, Port Washington, NY (US)

(73) Assignee: DAC Technology Inc., Port Washington, NY (US)

( * ) Notice: Subject to any disclaimer, the term of this patent is extended or adjusted under 35 U.S.C. 154(b) by 455 days.

(21) Appl. No.: 12/830,610

(22) Filed: Jul. 6, 2010

(65) Prior Publication Data

US 2011/0006752 A1    Jan. 13, 2011

Related U.S. Application Data

(60) Provisional application No. 61/223,461, filed on Jul. 7, 2009.

(51) Int. Cl.
    *G01R 31/02*    (2006.01)

(52) U.S. Cl. .................................... 324/537; 324/73.1

(58) Field of Classification Search .................. None
    See application file for complete search history.

(56) References Cited

U.S. PATENT DOCUMENTS 5,508,876 A * 4/1996 de la Croix Vaubois
                          et al. ............................ 361/117

* cited by examiner

*Primary Examiner* — Minh N Tang
(74) *Attorney, Agent, or Firm* — Renner, Otto, Boisselle & Sklar, LLP

(57) ABSTRACT

A method and apparatus which provide for measurement of embedded EMH, HIRF, or EMI (collectively referred to herein as EMH components), non-destructive measurement of embedded EMH components, component determination using only a simple current measurement; component determination without a priori knowledge of the range of values, the architecture of the test circuit that uses three MOSFET (or equivalent), switches, current measuring circuits, and suitable timing to accurately determine the component values, measurement of an embedded capacitor with relatively unknown parallel load resistance, and/or non-destructive measurement of R/C/TPD type components for any application.

17 Claims, 6 Drawing Sheets

METHOD AND APPARATUS FOR EVALUATING ELECTROMAGNETIC HAZARD PROTECTION DEVICES

CROSS-REFERENCE TO RELATED APPLICATION

This application claims priority under 35 U.S.C. §119 to U.S. Provisional Application No. 61/223,461, filed on Jul. 7, 2009.

TECHNICAL FIELD OF THE INVENTION

The present invention relates generally to test equipment, and more specifically to equipment for testing electromagnetic hazard (EMH) protection device(s).

DESCRIPTION OF THE RELATED ART

Avionics hardware is thoroughly tested following manufacture and prior to shipment, as well as after a repair. The test equipment for more complex equipment (referred to herein as the UUT, or unit-under-test) is generally computer controlled and the suite of tests is referred to as the ATP (Acceptance Test Procedure). Modern avionics hardware typically incorporates protection circuits for electromagnetic interference, EMI, and lightning transients. Protection is provided on signal lines connected to the input and output connector pins of the UUT. These EMI and lightning transient threats are sometimes lumped together and referred to as HIRF (high intensity radio frequency) or electromagnetic hazard (EMH) threats and there are standard tests to insure that the UUT is capable of withstanding these threats. Test requirements are published by ARINC, SAE, and the various aircraft manufacturers.

FIG. 1 represents schematically the equivalent circuit of a typical connector pin of a UUT, namely an input connector pin or an output connector pin. The components used to protect UUT hardware from EMH hazards are referred to herein as "EMH components". EMH components typically include an L-C EMI filter (not shown), or just an EMI capacitor 12, and a terminal protection device (TPD) 14, typically a zener diode or a Transzorb™. A gas discharge device, or other suitable voltage clamping component could also be included in place of or in addition to the TPD. The TPD 14 or EMI capacitor 12 are placed from the UUT connector pin, in this case an input pin, to one or more of the UUT's grounds. A series resistor 16 may also be incorporated between the input pin and the capacitor 12 or TPD 14. Sometimes an EMI choke (not shown) is in series also or is incorporated as part of an EMI filter. There is always a load impedance 18 at the UUT connector pin, and this load impedance 18 is composed of passive or active components and/or parasitic circuit components. The load impedance 18 is generally not known to a high degree of accuracy, but typically does not require measurement. It is generally sufficient to represent this load impedance 18 by a discrete resistance as shown in FIG. 1. The input series resistor 16, EMI capacitor 12, and TPD 14 require parametric measurement during acceptance testing; the load impedance 18 does not. The test equipment might also insert additional input resistance to facilitate testing of the UUT.

SUMMARY OF THE INVENTION

The present invention provides a test apparatus and method for testing the UUT for the integrity of the applicable protection device(s) to insure that the device hardware has been built correctly or does not have a failed EMH component.

These EMH components are generally not tested in any other way during the normal ATP for the UUT referred to above. This is because they are essentially transparent to normal operation, serving only a protection function (one may think of the fuse in one's computer—even though the computer self-tests many of its functions it has no way to test the fuse).

Therefore, a separate suite of automatic tests is desired in addition to a traditional ATP to confirm the integrity of these EMH components. The present invention provides the test apparatus and method for implementing the test suite. As will be described in more detail below, the test suite will measure the voltage of the TPD 14 (positive or negative, or bidirectional), the value of the EMI capacitor 12, and the value of the input series resistor 16. A series EMI choke, if present, is not measured and generally does not affect measurement of the other EMH components because of the high resonant frequency usually associated with the series EMI choke.

In accordance with an aspect of the invention, a method for evaluating electromagnetic hazard protection on a unit under test (UUT) is provided. The UUT has a connector pin with at least one electromagnetic hazard (EMH) component connected thereto within the UUT, and the method includes applying a sequence of voltage pulses which differ in pulse width to the connector pin; measuring a current at the connector pin in response to each of a plurality of voltage pulses with different pulse widths included in the sequence of voltage pulses; and determining a parameter of the EMH component based on the current measurements in response to each of the plurality of voltage pulses.

According to another aspect, the EMH component is a terminal protection device (TPD) and the parameter is the TPD voltage.

According to another aspect, the applying step includes progressively increasing the pulse width of the voltage pulses within the sequence of voltage pulses to progressively increase a voltage produced across the TPD in response to each voltage pulse.

In accordance with another aspect, the determining step includes comparing current measurements for successive voltage pulses included in the sequence in order to determine that the voltage produced across the TPD has reached the TPD voltage.

According to yet another aspect, upon determining the voltage produced across the TPD has reached the TPD voltage, the method includes measuring the current at the connector pin during one of the voltage pulses and measuring the current at the connector pin immediately following the one of the voltage pulses, and calculating the TPD voltage based on the measured current during and immediately following the one of the voltage pulses.

According to another embodiment, the EMH component is an input series resistor and the parameter is the resistance of the input series resistor.

In yet another aspect, the EMH component is an electromagnetic interference (EMI) capacitor and the parameter is the capacitance of the EMI capacitor.

According to another aspect, the method is non-destructive.

In accordance with still another aspect, the method utilizes measurement of only the currents at the connector pin in order to determine the parameter.

With still another aspect, a priori knowledge of a range of values within which the parameter is expected to exist is not applied.

In accordance with another aspect of the invention, a test apparatus for evaluating electromagnetic hazard protection on a unit under test (UUT) is provided. The UUT includes a connector pin with at least one electromagnetic hazard (EMH) component connected thereto within the UUT, and the apparatus includes: at least one functional circuit block for applying a sequence of voltage pulses which differ in pulse width to the connector pin; and a measurement circuit for measuring a current at the connector pin in response to each of a plurality of voltage pulses with different pulse widths included in the sequence of voltage pulses.

According to another aspect, the test apparatus further includes means for determining a parameter of the EMH component based on the current measurements in response to each of the plurality of voltage pulses.

In accordance with another aspect, the EMH component is a TPD and the means for determining is configured to calculate a TPD voltage of the TPD component.

According to still another aspect, the EMH component is an input series resistor and the means for determining is configured to calculate a resistance of the input series resistor.

In another aspect, the EMH component is an EMI capacitor and the means for determining is configured to calculate a capacitance of the EMI capacitor.

According to still another aspect, the measurement circuit includes three functional circuit blocks for selectively providing a positive voltage pulse, ground voltage pulse and negative voltage pulse, respectively, with prescribed timing to create the sequence of voltage pulses.

In still another aspect, the UUT includes a plurality of connector pins, and the test apparatus further comprises a matrix for controllably selecting which of the plurality of connector pins is evaluated by the at least one functional circuit block and the measurement circuit.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

In accordance with an exemplary embodiment, the TPD test function of the test apparatus in accordance with the present invention applies a voltage to the TPD 14 in excess of the known normal operating voltage of the UUT. This is because the voltage of the TPD 14 is typically selected to be above the normal operating voltage of the UUT. Since the TPD 14 of the UUT is typically designed for transient operation, not continuous duty at EMH stress levels, the test apparatus of the present invention must also not overstress the UUT. It must also not overstress the load circuit represented by load impedance 18.

The presence of the input series resistor 16 prevents direct access to the terminals of the TPD 14 and EMI capacitor 12. Therefore to determine the voltage of the TPD 14 or capacitance of the EMI capacitor 12 the measurement is an indirect measurement. The unknown load impedance 18 may further complicate the problem. The test apparatus and methods described below in accordance with the present invention are both unique and simple. They solve the aforementioned measurement problems in a simple manner and testing is readily achievable in an automatic mode.

1. Circuit Operation

Figure 1:
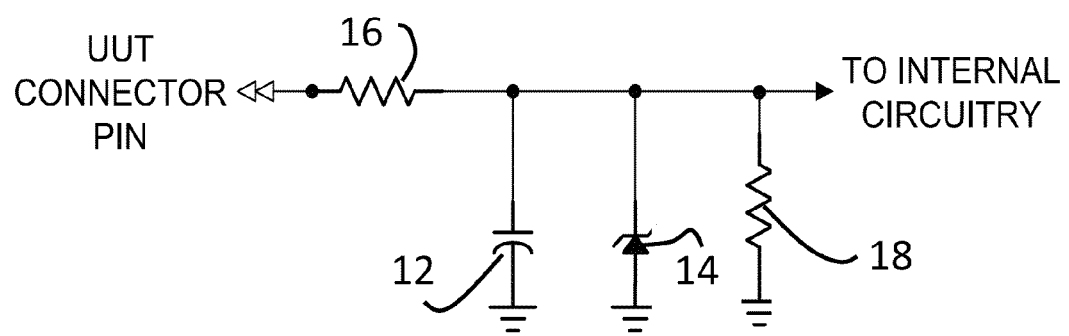
FIG. 1 is a circuit schematic of a typical protection device.
Figure 2:
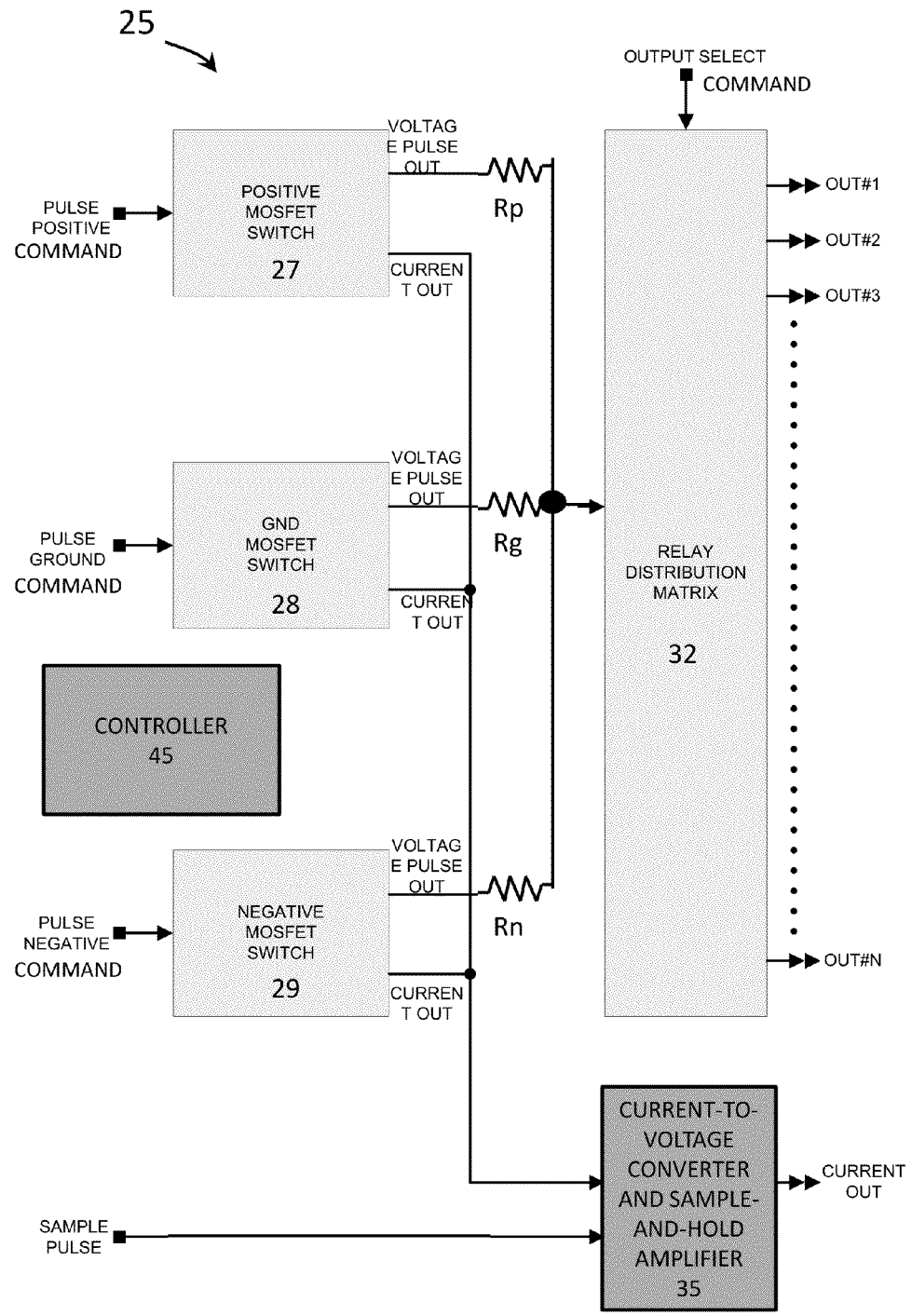
FIG. 2 is a block diagram of a test apparatus in accordance with an exemplary embodiment of the invention.

Referring to FIG. 2, a test apparatus 25 in accordance with an exemplary embodiment of the invention is shown. The test apparatus 25 incorporates three similar functional circuit blocks 27, 28 and 29, respectively. Each block 27, 28 and 29 includes a low resistance switch (e.g., a MOSFET with suitable driver), referred to herein as the POS switch, GND switch and NEG switch, respectively. Each block 27, 28 and 29 also includes a switch-current measuring circuit for measuring the current output through the block at switching. The switch-current measuring circuit in turn outputs a corresponding switch current measurement. Although not shown in FIG. 2, a suitable low resistance switch and switch-current measuring circuit for inclusion in the corresponding functional circuit block 27-29 will be readily known to one having ordinary skill in the art.

As is shown in FIG. 2, the functional circuit block 27 receives a pulse positive command at an input. Similarly, the functional circuit blocks 28 and 29 receive a pulse ground command and pulse negative command, respectively. The format of the three commands may be in any of a multitude of formats readily known to one having ordinary skill in the art. In response to receiving the respective commands, the positive switch in block 27 serves to switch a positive voltage pulse to a selected UUT connector pin. The ground switch in block 28 serves to switch a ground pulse to the selected UUT connector pin, and the negative switch in block 29 serves to switch a negative voltage pulse to the selected UUT connector pin. The voltage and ground pulse widths are defined by the command signal.

The voltage pulse outputs from the respective functional circuit blocks 27-29 are OR'ed together and input into to a relay distribution matrix 32 included in the test apparatus 25. The relay distribution matrix 32 is configured to direct the voltage pulse outputs from the respective blocks 27-29 selectively to the different UUT connector pins to be tested via corresponding outputs OUT#1 through OUT#N. The particular output OUT#1 through OUT#N is selected based on an output select command input to the relay distribution matrix 32. The voltage pulse outputs from the respective functional circuit blocks 27-29 may be OR'ed together since only one type of pulse is provided at a time. It will be appreciated, however, that the voltage pulse outputs may instead be received separately by the relay distribution matrix 32 and switched to the selected connector pin under test. Also, it is shown in FIG. 2 that the test apparatus 25 may itself have some resistance associated with the output of the respective functional circuit blocks 27-29. Such resistance is represented in FIG. 2 by resistances Rp, Rg, and Rn, respectively.

The test apparatus 25 further includes a controller 45 configured to provide the various pulse positive, pulse ground and pulse negative commands to the functional circuit blocks 27-29 appropriate for the particular test being conducted. Similarly, the controller 45 is configured to provide an output select command to the relay distribution matrix 32 to select the particular UUT connector pin to be tested. The controller 45 may be virtually any controller, microprocessor, or other control circuit programmed or designed to control the components within the test apparatus 25 as described herein. Those having ordinary skill in the art will readily recognize how to program or configure the controller 45 to carry out the functions described herein. Accordingly, further detail is omitted for sake of brevity.

In this manner, the three switches in the functional circuit blocks 27, 29 and 28 controllably switch either a positive voltage, VPOS, a negative voltage, VNEG, or ground, GND, respectively to the UUT connector pin under test. By switching on and off, the switches provide a corresponding pulse which is provided to the UUT connector pin under test. In a typical test set the switched voltage is directed to the selected UUT input pins requiring testing via the relay distribution matrix 32, or equivalent. The POS, NEG, and GND low resistance switches of the functional circuit blocks 27, 29 and 28, respectively, may be of any suitable architecture. MOSFET switches are one obvious choice, as long as they satisfy voltage drop requirements dictated by the measurement accuracy and speed requirements which in turn are dictated by the circuit time constants as will be appreciated.

Switch current is measured by the respective switch-current measuring circuit during the switch's ON time. By switch current, it is meant generally the current provided by the respective functional circuit block to the UUT connector pin under test while the switch for that functional circuit block is ON. For this embodiment in FIG. 2, the switch current measurements from the respective functional circuit blocks 27, 29 and 28 are OR'ed together and input to a current-to-voltage converter and sample-and-hold amplifier 35. The converter/amplifier 35 may further condition the current measurements output from the respective functional circuit blocks 27-29 and holds the same for conversion by an A/D converter (not shown).

It is noted that the switch current measurements output from the respective functional circuit blocks 27-29 may be OR'ed because only one switch is on at a time. The switch current measurements could also be treated independently in an alternative embodiment. For this discussion, switch current is measured just before POS or NEG switch turn-off and just after GND switch turn on. It will be appreciated, however, that because the expected current waveform is an exponential function, the measurement can be made at other times in the waveform and the current just at turn-on or turn-off can be extrapolated. At times this may be advantageous. For the discussion that follows only positive voltage TPD measurements using a positive voltage VPOS will be addressed (measurements of negative voltage TPDs using a negative voltage VNEG follow the same principle and thus a description thereof is omitted for sake of brevity). The switch currents used in the subsequent calculations are defined as follows:

$I+$ = current just before the POS switch in block 27 turns off.

$I-$ = current just after the GND switch in block 28 turns on.

It will be appreciated by one having ordinary skill in the art that if an EMI choke is present the I– measurement may have to be delayed until the inductive transients have died out. In general this delay is small relative to the Vc fall time and introduces little error in the measurement. If this is not the case, the inductive transients can be minimized by increasing the GND switch resistance Rg until the fall time meets this criteria.

Component Calculations using I+ and I–

For the calculations below:

$Vz$ = TPD 14 voltage $Vc$ = EMI capacitor 12 voltage $Vcc$ = Unloaded switch voltage (typically the power supply voltage), and relatedly the voltage amplitude of the pulse $Vss$ = Steady state capacitor voltage (pulse width equals infinity and TPD removed)

$Ri$ = input series resistor 16 to be measured (plus any tester resistance: Rp, Rn, Rg)

$C$ = Capacitance of EMI Capacitor 12 to be measured $T$ = Pulse width used for capacitance measurement test $n$ = Index variable $Tpn$ = General pulse width for the nth positive pulse $I+n$ = Current just before POS switch turns off on the nth pulse $I-n$ = Current just after GND switch turns on in the nth pulse $t$ = The general time variable It is shown below that from the amplitude of the impressed voltage pulse, Vcc, and the measurements simply for I+ and I– at selected pulse widths, the voltage Vz of the TPD 14, capacitance C of the EMI capacitor 12, and resistance Ri of the input series resistor 16 can be determined. The calculations are relatively independent of load impedance 18 for load impedance values greater than the input series resistor 16 which is almost universally the case. If the load impedance 18 is known its value can be included in the calculations to enhance the accuracy but that simple modification is omitted herein for brevity.

If the expected component values Vz, C and Ri are known a priori, then the range of test pulse widths applied in accordance with the methods described herein can also be determined a priori. However no a priori knowledge is needed to make the measurement on an arbitrary circuit. The minimum pulse width can be conservatively small, and the process is self limiting. When the maximum necessary pulse width is reached the test ends and minimizes component power dissipation during test. To insure EMH component safety, the pulse repetition rate is chosen low enough to limit the maximum component power dissipation.

As will be appreciated, the pulse repetition rate is determined by Tpn plus the width of the ground pulse (the time VGND is commanded). It is the inverse of the sum of these two pulses, and is the same as pulse frequency. The ground pulse width may be fixed or variable but Tpn varies with each cycle (typically doubles). Thus the pulse repetition rate will not be constant if the ground pulse width is constant and this must be taken into account when examining component power dissipation.

As described herein, the initial selected amplitudes, pulse widths, time constants, etc. may be preselected and stored in the controller 45, for example, prior to actual testing. The data acquired by the controller 45 during the measurement of the currents I+ and I– may be analyzed by the controller 45 to determine the relevant values of the EMH components. In an alternative embodiment, the current measurements may be stored and subsequently analyzed by some other computing device separate from the test apparatus.

2. Measurement Process for the TPD 14 and Input Series Resistor 16

Figure 3:
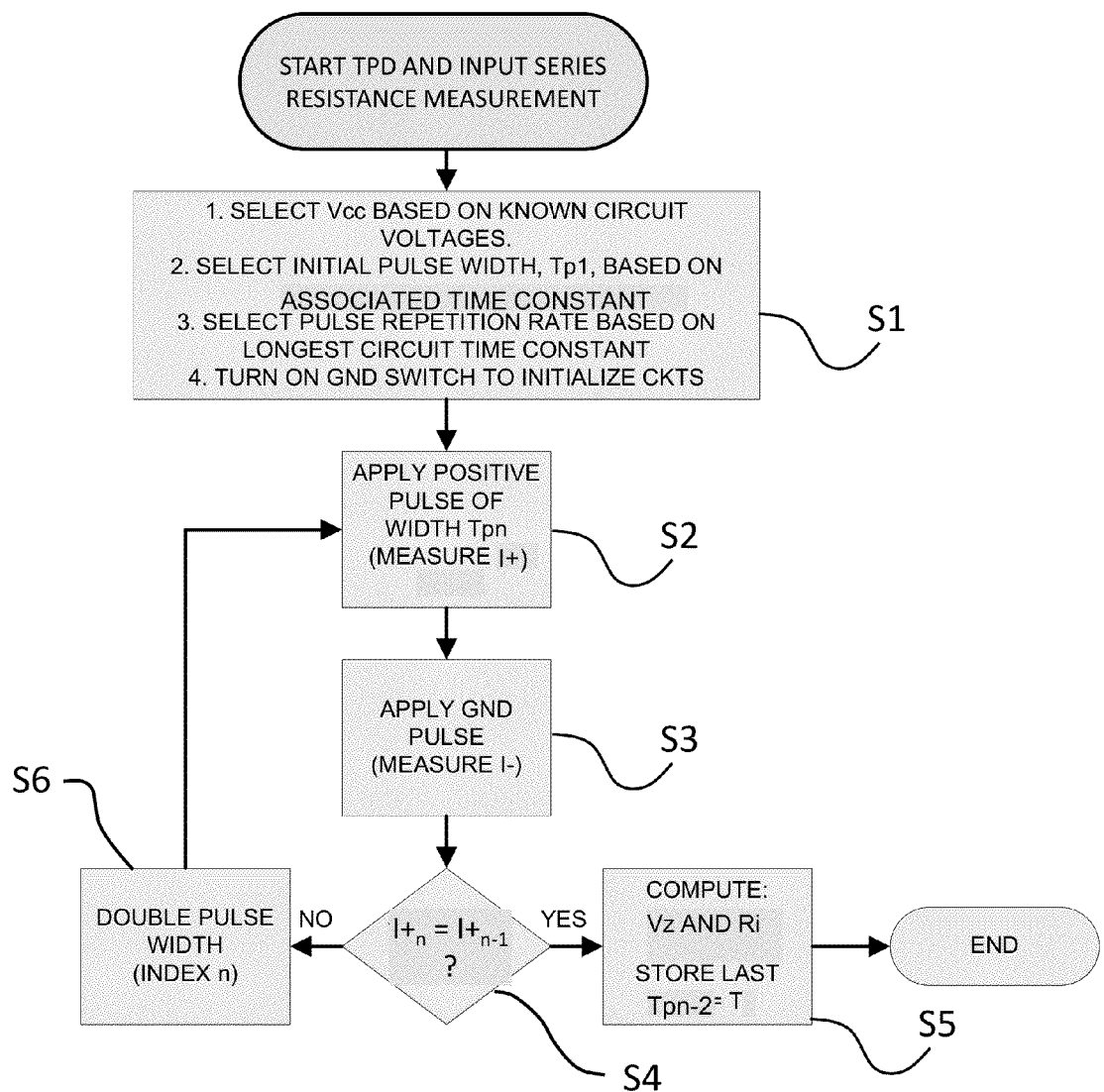
FIG. 3 is a logic flow diagram of the TPD and input series resistance measurement function in accordance with an exemplary embodiment of the invention.

Referring to FIG. 3, a flowchart is shown describing an embodiment for carrying out testing of the TPD 14 and input series resistance (resistor 16) in accordance with the invention. In this embodiment, the functional circuit blocks 27-29 are controlled so as to output a series of positive voltage pulses each immediately followed by a corresponding ground pulse, resulting in a pulse train (it will be appreciated, however, that pulse width in the discussion that follows refers only to that of the positive pulse). Each successive pulse width within the pulse train is greater than the previous pulse width. A doubling of pulse width with each successive pulse is a logical progression and is assumed herein. It will be appreciated, however, that some other progression could be utilized without departing from the scope of the invention.

Beginning in step S1, the unloaded switch voltage (typically the power supply voltage Vcc) is selected based on the known circuit voltages at issue with respect to the UUT. An initial pulse width (Tp1) is selected based on the time constant associated with the expected EMH component values of the UUT connector pin circuit under test. Tp1 will be much less than the time constant. If the time constant with respect to the expected EMH component values is unknown, Tp1 can be made arbitrarily small within the general constraints of the test equipment. The voltage amplitude (in this case the power supply voltage Vcc) is selected to insure that the TPD 14 will turn on, given the voltage divider set up by the input series resistor 16 and the equivalent load impedance 18. A reasonable selection for Vcc is twice the nominal TPD 14 voltage although an experienced user may select another based on a priori UUT knowledge, faster test time, test equipment capability, etc.

Also in step S1, a pulse repetition rate for the pulse train is selected based on the longest circuit time constant expected at the UUT connector pin under test. A reasonable selection for pulse repetition rate is ten times the nominal pin time constant. The pulse repetition rate must also be low enough to not exceed any component power limit. Once these parameters have been established in step S1, the controller 45 turns on the GND switch in functional circuit block 28 for a time long enough to discharge the capacitance of the input circuit under test to within the requirements for measurement accuracy (typically at least 10 input pin time constants) in order to initialize all the circuits at the UUT connector pin which is under test.

Next, in step S2 the controller 45 causes functional circuit block 27 to apply a positive pulse of width Tp1 to the UUT connector pin under test. The switch-current measuring circuit within the functional circuit block 27 in turn provides a signal representing the measured switch current I+n, where n=1, to the converter/amplifier 35.

In step S3, the controller 45 causes the POS switch in functional circuit block 27 to switch off after time Tp1, thereby defining the pulse width and the current I+n which is measured by the switch-current measuring circuit. At the same time, the controller 45 causes the GND switch in functional circuit block 28 to turn on so as to immediately follow the positive pulse in step S2 with a GND pulse. The switch-current measuring circuit within the functional circuit block 28 in turn outputs the measured switch current I−n, where n=1, to the converter/amplifier 35.

The switch currents, I+n and I−n, as obtained in steps S2 and S3 are digitized by the converter/amplifier 35 and stored in the controller 45, a test computer, or the like. Next, in step S4 the controller 45 (or other processing device) compares I+n to I+n−1. As will be appreciated, the pulse train should be terminated when it is noted that I+ stops decreasing with increasing pulse width. Thus, if I+n and I+n−1 are equal to one another as determined in step S4, the process proceeds to step S5 in which the controller 45 computes Vz and Ri as described below.

More particularly, the resistance Ri, representing the resistance of the input series resistor 16 plus any tester resistance Rp, Rg, Rn, and the TPD 14 voltage Vz are calculated as discussed below based on I+, I−, and Vcc. Also in step S5, Tpn-2, the second to last pulse width before termination of the pulse train, is set equal to the pulse width T which may be used in the subsequent calculations.

If in step S4 the measured I+n to I+n−1 are not equal, the process proceeds to step S6 whereby the pulse width of the positive pulse is doubled and n is increased by 1. The process then returns to step S2 and the above described process is repeated until such time as I+n and I+n−1 are equal to one another.

Figure 4:
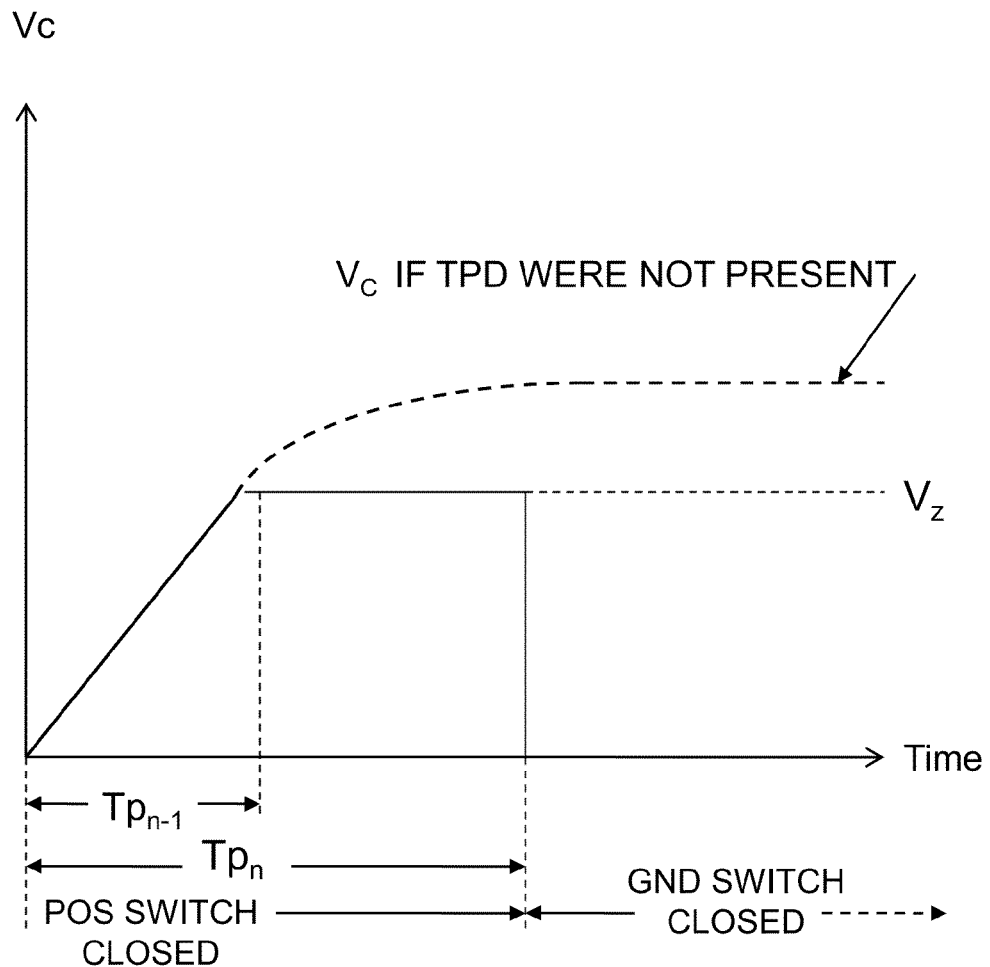
FIG. 4 is a timing diagram that shows a typical EMI capacitor voltage during the measurement of the TPD voltage and Ri.

FIG. 4 illustrates the voltage on the EMI capacitor 12 for a time equal to the final pulse width Tpn. Also shown for reference is the amplitude at the end of the previous pulse, Tpn-1. The figure shows the point in time where the TPD 14 has turned on and the EMI capacitor voltage Vc for the last two pulses is equal. Also shown for reference is the exponential charging voltage curve (dashed line) that would result on the EMI capacitor 12 if the TPD 14 were not present.

3. Measurement Process for EMI Capacitor 12

Figure 5:
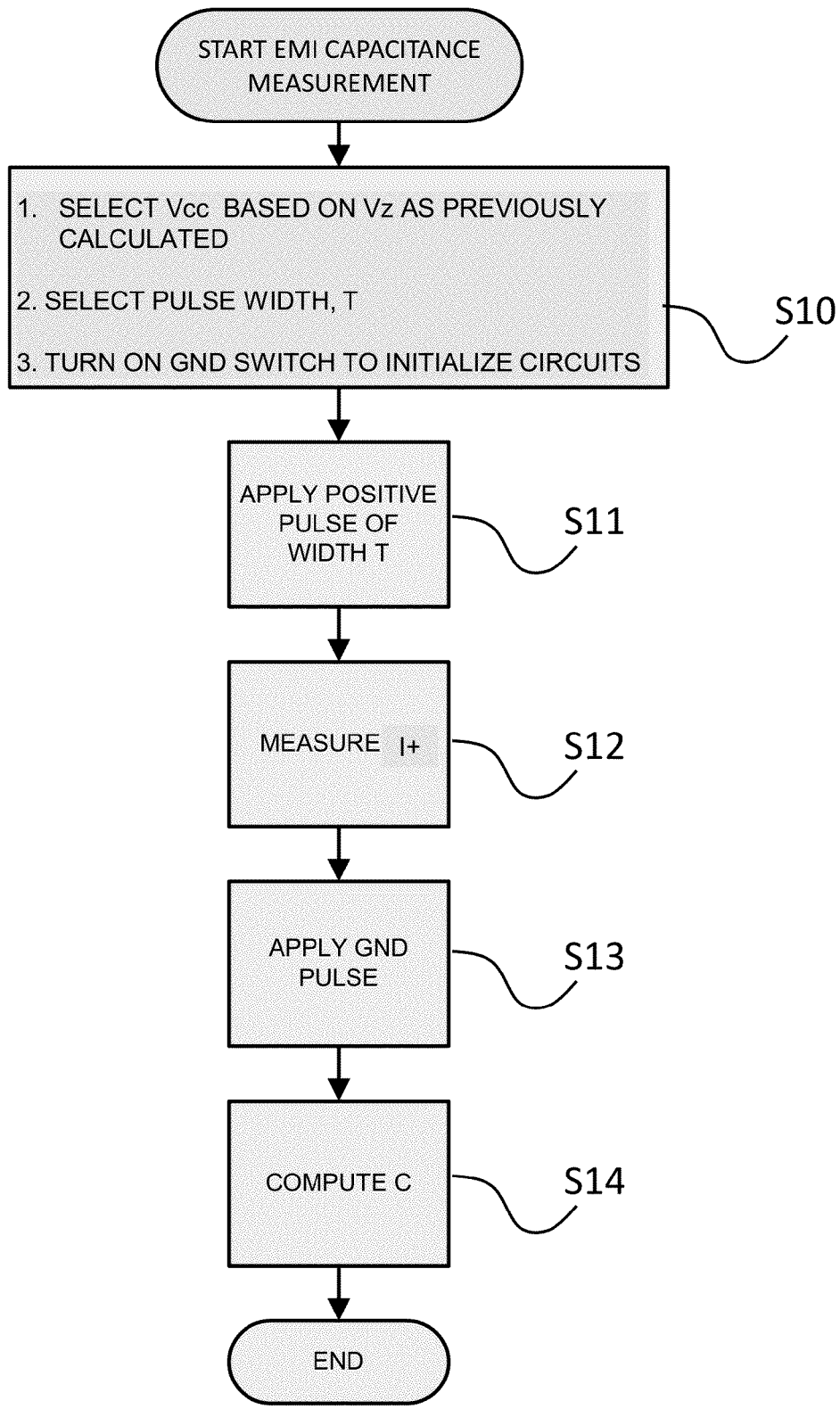
FIG. 5 is a logic flow diagram of the EMI capacitance measurement function in accordance with an exemplary embodiment of the invention.

Referring to FIG. 5, a flowchart is shown describing an embodiment for carrying out testing of the EMI capacitor 12 in accordance with the invention. In this embodiment, the functional circuit blocks 27-29 are controlled so as to output a single voltage pulse for the capacitor measurement.

Beginning in step S10, a pulse amplitude, Vcc, and pulse width T are selected. The pulse amplitude and width are typically selected to produce a pulse that does not turn on the TPD 14 and whose width is less than the circuit time constant at the pin under test. A small pulse width is desirable to produce a more linear voltage rise on the capacitor and to thereby simplify the capacitance calculation. A reasonable selection for Vcc is the value of Vz as determined in the previous test sequence illustrated in FIG. 3. A reasonable selection for T is Tpn-2 from the measurement process in Section 2 above. Generally, any a priori knowledge of the expected circuit values would allow a selection of Vcc and T that better insures a linear rise time and sufficient signal amplitude for measurement. Also in step S10, in order to initialize the circuits in the connector pin under test, the GND switch is turned on to deliver a ground pulse VGND.

In step S11 the positive pulse of amplitude Vcc and width T is applied to the connector pin under test as a result of the controller 45 providing an appropriate command to the functional circuit block 27. In step S12 I+ is measured at the end of the positive pulse by the switch current measuring circuit in the functional circuit block 27. In step S13 the controller 45 causes the functional circuit block 28 to apply a ground pulse VGND to discharge the EMI capacitor 12. In step S14 the measurement results are used to calculate the capacitance C of the EMI capacitor 12 as discussed in more detail below.

Figure 6:
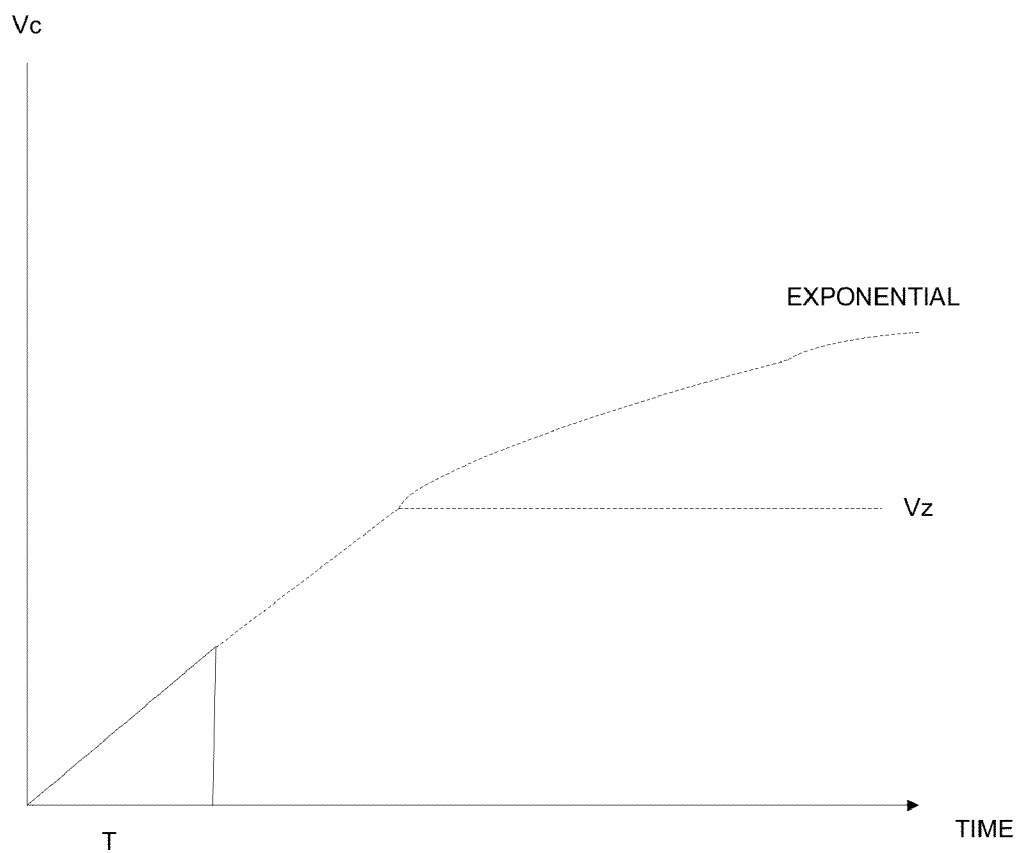
FIG. 6 is a timing diagram that shows a typical EMI capacitor voltage during the measurement of capacitance.

FIG. 6 illustrates the voltage on the EMI capacitor 12 during the test. Also shown for reference and in dashed line are capacitor voltages for longer pulses that show the exponential waveform that would appear if the TPD 14 were not present and the waveform that is clamped to the TPD 14 voltage when it is present.

4. Calculation of TPD 14 and Input Series Resistor 16 Component Values

For a pulse Tpn where I+ equals previous pulse's I+ as determined in step S4 in FIG. 3, the EMI capacitor 12 has charged up to the TPD 14 voltage Vz. The controller 45 can then perform the calculations in step S5 based on the following relationships (where Vcc, I+ and I− are known from steps S1, S2 and S3, respectively):

$$I+ = (Vcc - Vz)/Ri$$

$$I- = Vz/Ri$$

Dividing the two equations gives the value of Vz:

$$Vz = Vcc/(1+(I+/I-))$$

And substituting gives the value of the input series resistance Ri:

$$Ri = Vz/I- = (Vcc-Vz)/I+$$

The above calculations ignore the TPD 14 resistance which is usually orders of magnitude less than Ri (input series resistance 16 value) and contribute negligible error to the result. If desired, this resistance could be taken into account.

5. Calculation of Capacitance C of EMI Capacitor 12

As represented in step S14 the capacitance C is calculated using the measured value of I+ as obtained in step S12 and Ri as obtained in step S5 in the test of FIG. 3. This measurement of I+ includes errors caused by the unknown load resistor 18. The error due to the relatively unknown load resistor 18, however, can be made arbitrarily small by reducing the pulse width Tin step S10 and therefore reducing the capacitor voltage, Vc, at the end of the positive pulse in step S11. Of course at some point noise limits the actual measurements so the error cannot be entirely eliminated. For this condition where Vc<<Vss, the capacitor charging exponential can be approximated by a straight line with slope of Vcc/RiC representing the initial portion of the exponential charging curve.

Therefore, $$Vc = Vcc(t)/(Ri)(C)$$

Typically, Vz is less than half of Vss. However, for any pulse where Vc is low enough for acceptable error due to loading:

At the end of the pulse, $$Vc = Vcc - (Ri)(I+)$$

Equating the right side of the two equations for Vc above, substituting T for t, and solving for C, gives, $$C = T/[Ri - (Ri)^2(I+)/Vcc]$$

Alternatively, if it is not clear that the capacitor charging waveform is in the linear region but is starting to conform to the exponential, the shape of the capacitor charging curve can be determined from a series of measurements of I+ for predetermined increasing pulse widths and the initial slope of the charging curve can be extracted from the data.

It will be appreciated that the measurements of the switching currents and the associated processing of the measured current data to determine the component values may be carried out in real time. Alternatively, the measured current data may be processed subsequent to acquisition.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

The invention claimed is:

1. A method for evaluating electromagnetic hazard protection on a unit under test (UUT), the UUT having a connector pin with at least one electromagnetic hazard (EMH) component connected thereto within the UUT, comprising:
    applying a sequence of voltage pulses which differ in pulse width to the connector pin;
    measuring a current at the connector pin in response to each of a plurality of voltage pulses with different pulse widths included in the sequence of voltage pulses; and
    determining a parameter of the EMH component based on the current measurements in response to each of the plurality of voltage pulses.

2. The method according to claim 1, wherein the EMH component is a terminal protection device (TPD) and the parameter is the TPD voltage.

3. The method according to claim 2, wherein the applying step comprises progressively increasing the pulse width of the voltage pulses within the sequence of voltage pulses to progressively increase a voltage produced across the TPD in response to each voltage pulse.

4. The method according to claim 3, wherein the determining step comprises comparing current measurements for successive voltage pulses included in the sequence in order to determine that the voltage produced across the TPD has reached the TPD voltage.

5. The method according to claim 4, wherein upon determining the voltage produced across the TPD has reached the TPD voltage, measuring the current at the connector pin during one of the voltage pulses and measuring the current at the connector pin immediately following the one of the voltage pulses, and calculating the TPD voltage based on the measured current during and immediately following the one of the voltage pulses.

6. The method according to claim 1, wherein the EMH component is an input series resistor and the parameter is the resistance of the input series resistor.

7. The method according to claim 1, wherein the EMH component is an electromagnetic interference (EMI) capacitor and the parameter is the capacitance of the EMI capacitor.

8. The method according to claim 1, wherein the method is non-destructive.

9. The method according to claim 1, wherein the method utilizes measurement of only the currents at the connector pin in order to determine the parameter.

10. The method according to claim 1, wherein a priori knowledge of a range of values within which the parameter is expected to exist is not applied.

11. A test apparatus for evaluating electromagnetic hazard protection on a unit under test (UUT), the UUT having a connector pin with at least one electromagnetic hazard (EMH) component connected thereto within the UUT, comprising:
    at least one functional circuit block for applying a sequence of voltage pulses which differ in pulse width to the connector pin; and
    a measurement circuit for measuring a current at the connector pin in response to each of a plurality of voltage pulses with different pulse widths included in the sequence of voltage pulses.

12. The test apparatus according to claim 11, further comprising means for determining a parameter of the EMH component based on the current measurements in response to each of the plurality of voltage pulses.

13. The test apparatus according to claim 12, wherein the EMH component is a TPD and the means for determining is configured to calculate a TPD voltage of the TPD component.

14. The test apparatus according to claim 12, wherein the EMH component is an input series resistor and the means for determining is configured to calculate a resistance of the input series resistor.

15. The test apparatus according to claim 12, wherein the EMH component is an EMI capacitor and the means for determining is configured to calculate a capacitance of the EMI capacitor.

16. The test apparatus according to claim 11, wherein the measurement circuit comprises three functional circuit blocks for selectively providing a positive voltage pulse, ground voltage pulse and negative voltage pulse, respectively, with prescribed timing to create the sequence of voltage pulses.

17. The test apparatus according to claim 11, wherein the UUT includes a plurality of connector pins, and the test apparatus further comprises a matrix for controllably selecting which of the plurality of connector pins is evaluated by the at least one functional circuit block and the measurement circuit.

* * * * *